(12) United States Patent
Ha et al.

(10) Patent No.: US 11,493,814 B2
(45) Date of Patent: Nov. 8, 2022

(54) DISPLAY DEVICE

(71) Applicant: LG Display Co., Ltd., Seoul (KR)

(72) Inventors: Sung-Bong Ha, Daegu (KR);
Moon-Soo Kang, Daegu (KR);
Jun-Yong Choi, Busan (KR);
Shi-Hyung Park, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 2 days.

(21) Appl. No.: 17/114,228

(22) Filed: Dec. 7, 2020

(65) Prior Publication Data

US 2021/0088863 A1 Mar. 25, 2021

Related U.S. Application Data

(63) Continuation of application No. 15/824,675, filed on Nov. 28, 2017, now Pat. No. 10,890,816.

(30) Foreign Application Priority Data

Dec. 23, 2016 (KR) ........................ 10-2016-0178320

(51) Int. Cl.
| | |
|---|---|
| *G02F 1/1362* | (2006.01) |
| *G06F 1/16* | (2006.01) |
| *H01L 27/12* | (2006.01) |
| *G02F 1/1333* | (2006.01) |

(52) U.S. Cl.
CPC .. *G02F 1/136286* (2013.01); *G02F 1/136204* (2013.01); *G06F 1/1652* (2013.01); *H01L 27/124* (2013.01); *G02F 1/133391* (2021.01)

(58) Field of Classification Search
CPC ......... G02F 1/136286; G02F 1/136204; G02F 1/133391; G06F 1/1652; H01L 27/124
See application file for complete search history.

(56) References Cited

U.S. PATENT DOCUMENTS

| | | | |
|---|---|---|---|
| 6,437,767 B1 * | 8/2002 | Cairns ................. | G09G 3/3666 345/98 |
| 7,868,865 B2 | 1/2011 | Shin et al. | |
| 8,471,981 B2 | 6/2013 | Kim et al. | |

(Continued)

FOREIGN PATENT DOCUMENTS

| | | |
|---|---|---|
| CN | 1363921 A | 8/2002 |
| CN | 1822728 A | 8/2006 |

(Continued)

*Primary Examiner* — James A Dudek
(74) *Attorney, Agent, or Firm* — Birch, Stewart, Kolasch & Birch, LLP

(57) ABSTRACT

Discussed is a display device including a display panel, first gate lines located on the display panel, second gate lines separated from the first gate lines and located on the display panel, first data lines provided on the display panel corresponding to a first display area to cross the first gate lines and defining first pixel areas configuring the first display area, second data lines provided on the display panel corresponding to a second display area to cross the second gate lines and second pixel areas configuring the second display area, wherein the first pixel areas and the second pixel areas have the same size, and wherein a separation area is interposed between the first gate lines and the second gate lines, and a width of the separation area is equal to or wider than a width of a thin film transistor.

18 Claims, 8 Drawing Sheets

(56) References Cited

U.S. PATENT DOCUMENTS

| | | |
|---|---|---|
| 2002/0084965 A1 | 7/2002 | Park et al. |
| 2006/0114196 A1 | 6/2006 | Shin et al. |
| 2008/0218652 A1 | 9/2008 | Kim et al. |
| 2011/0169800 A1 | 7/2011 | Jun et al. |
| 2012/0194773 A1* | 8/2012 | Kim .................... G09G 3/3674 349/139 |
| 2013/0094166 A1 | 4/2013 | Yokoyama et al. |
| 2015/0161928 A1* | 6/2015 | Kim .................... G09G 3/3666 345/1.3 |
| 2015/0279332 A1 | 10/2015 | Hu et al. |
| 2015/0287365 A1* | 10/2015 | Song .................... G09G 3/035 345/82 |
| 2016/0210916 A1 | 7/2016 | Jeong et al. |
| 2016/0217729 A1 | 7/2016 | Kim et al. |
| 2017/0154598 A1 | 6/2017 | Park et al. |
| 2017/0255324 A1 | 9/2017 | Oka et al. |

FOREIGN PATENT DOCUMENTS

| | | |
|---|---|---|
| CN | 102651206 A | 8/2012 |
| CN | 102934152 A | 2/2013 |
| CN | 104882065 A | 9/2015 |

* cited by examiner

DISPLAY DEVICE

CROSS REFERENCE TO RELATED APPLICATIONS

This application is a Continuation of U.S. patent application Ser. No. 15/824,675, filed on Nov. 28, 2017, which claims the priority benefit of Korean Patent Application No. 10-2016-0178320, filed on Dec. 23, 2016, the entire contents of all these applications are hereby expressly incorporated by reference into the present application.

BACKGROUND OF THE INVENTION

Field of the Invention

The present invention relates to a display device and, more particularly, to a display device capable of performing at least dual display on one monitor.

Discussion of the Related Art

Generally, mono display means that only one image is displayed on one monitor. Mono display is characterized in that one image is implemented on one monitor. That is, in mono display, one video program is executed on one monitor using one computer.

However, if a display device for implementing only one image on one monitor is used for military products or industrial products frequently exposed to impact, the military products or industrial products may not be used due to impact or partial damage, thereby causing significant problems.

Accordingly, a display device capable of implementing only one image on one monitor may cause problems in military products or industrial products frequently exposed to impact.

Therefore, there is a need for a display device capable of implementing at least two images on one monitor in military products or industrial products frequently exposed to impact.

SUMMARY OF THE INVENTION

Accordingly, the present invention is directed to a display device that substantially obviates one or more problems due to limitations and disadvantages of the related art.

An object of the present invention is to provide a display device capable of performing at least dual display on one monitor.

Another object of the present invention is to provide a display device capable of preventing static electricity from occurring between adjacent electrodes in horizontally split portions of gate lines.

Another object of the present invention is to provide a display device suitable for a military display product or an industrial display product frequently exposed to impact by implementing different images or the same image in a first display area and a second display defined on one screen.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a display panel having a first display area and a second display area and configured to display an image in the first and second display areas, a plurality of first gate lines located on the display panel corresponding to the first display area, a plurality of second gate lines separated from the first gate lines and located on the display panel corresponding to the second display area, a plurality of first data lines provided on the display panel corresponding to the first display area to cross the first gate lines and defining a plurality of first pixel areas configuring the first display area, and a plurality of second data lines provided on the display panel corresponding to the second display area to cross the second gate lines and defining a plurality of second pixel areas configuring the second display area.

The first gate lines and the second gate lines may be separated from each other by a predetermined distance in a diagonal direction.

The second gate lines may be located in parallel above the first gate lines to correspond to each other in a diagonal direction.

Second thin film transistors at intersections between the second gate lines and the second data lines may be located above first thin film transistors at intersections between the first gate lines and the first data lines to correspond to each other in a diagonal direction.

A layout of the second gate lines and the second data lines may be equal to that of the 180-degree rotated first gate lines and the first data lines.

The first gate lines and the second gate lines may be provided in parallel on the same line to be spaced apart from each other by a predetermined distance.

The second gate lines may overlap a second data line located at an outermost side of the second display area.

The second gate lines may be provided to be spaced apart from a second data line located at an outermost side of the second display area.

The display device may further include a first driving unit for providing first driving signals for displaying the image to the first gate lines and the first data lines and a second driving unit for providing second driving signal for displaying the image to the second gate lines and the second data lines.

The first driving unit may include a first gate driving unit for providing first gate signals to the first gate lines, a first data driving unit for providing first data signals to the first data lines and a first timing controller for controlling the first gate driving unit and the first data driving unit, and the first driving signals may include the first gate signals and the first data signals.

The second driving unit may include a second gate driving unit for providing second gate signals to the second gate lines, a second data driving unit for providing second data signals to the second data lines and a second timing controller for controlling the second gate driving unit and the second data driving unit, and the second driving signals may include the second gate signals and the second data signals.

The display device may be any one of a liquid crystal display (LCD), an organic light emitting diode (OLED) display device, a curved display device, a rollable display device and a bendable display device.

Images implemented in the first display area and the second display area may be different from or equal to each other.

In the display device according to one or more embodiments of the present invention, since the gate lines corresponding to the first display area and the second display area are separated from each other and are independently driven, it is possible to perform a dual display function for independently implementing different images on one screen.

In the display device according to one or more embodiments of the present invention, since the first gate lines of the first display area and the second gate lines of the second display area are separated from each other by the predetermined distance, different images or the same images can be implemented in the first display area and the second display area. Therefore, even when a portion of the display device, that is, the first display area or the second display area, is damaged by external impact, a desired image can be continuously implemented in the other display area.

In addition, the display device according to one or more embodiments of the present invention is suitable for military display products or industrial display products frequently exposed to impact, because the first gate lines of the first display area and the second gate lines of the second display area are separated from each other such that different images or the same image is implemented in the first display area and the second display area.

In addition, in the display device according to one or more embodiments of the present invention, the display area may be used as one display area or divided into the first display area and the second display area. Therefore, in a normal state, the display area may be used as one screen. However, when any one of the first and second display areas of the display device is damaged by impact, only the other area may be used.

Further, in the display device according to one or more embodiments of the present invention, the layout of the second gate lines and second data lines of the second display area is equal to that of the 180-degree rotated first gate lines and first data lines of the first display area, such that the second gate lines of the second display area are provided to correspond to the first gate lines of the first display area in a diagonal direction, the first gate lines of the first display area and the second gate lines of the second display area are separated from each other by the predetermined distance, or the second gate lines of the second display area are spaced apart from the second data line located at the outermost side of the second display area without overlapping. Therefore, the distance between the second gate lines and the first gate lines increases, thereby preventing static electricity from occurring between the electrodes.

Accordingly, in the display device according to one or more embodiments of the present invention, the distance between the first gate lines of the first display area and the second gate lines of the second display area is maximized to prevent static electricity from occurring between the electrodes, thereby increasing product yield.

In addition, the display device according to one or more embodiments of the present invention is applicable to an organic light emitting diode (OLED) display device, a curved display device, a rollable display device and a bendable display device, in addition to a liquid crystal display (LCD) device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Hereinafter, preferred embodiments of a liquid crystal display device according to the present invention will be described in detail with reference to the accompanying drawings so as to be easily implemented by those skilled in the art.

Although a liquid crystal display (LCD) device is described in the embodiments of the present invention, the present invention is not limited thereto and is applicable to an emission type display device such as an electroluminescence (EL) display, a light emitting diode (LED), a vacuum fluorescent display (VFD), a field emission display (FED) or a plasma display panel (PDP) and a non-emission type display device.

The advantages and features of the present invention and the way of attaining the same will become apparent with reference to embodiments described below in detail in conjunction with the accompanying drawings. Embodiments, however, may be embodied in many different forms and should not be constructed as being limited to exemplary embodiments set forth herein. Rather, these exemplary embodiments are provided so that this disclosure will be thorough and complete and will fully convey the scope to those skilled in the art. The scope of the present invention should be defined by the claims. Wherever possible, the same reference numbers will be used throughout the drawings to refer to the same or like parts. The term 'may' completely encompasses the full meanings of the term 'can'.

Figure 1:
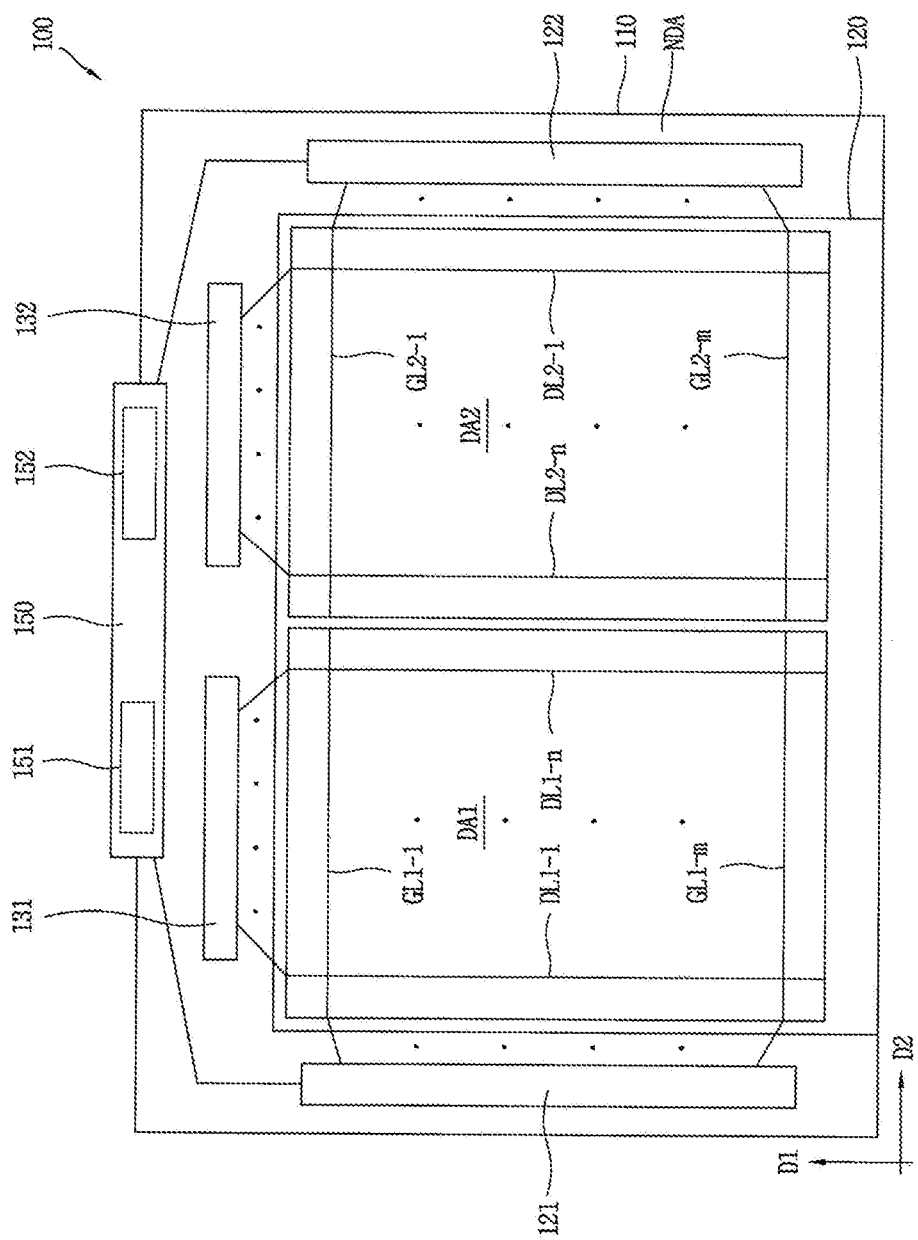
FIG. 1 is a plan view schematically showing the configuration of a display device according to an embodiment of the present invention.

FIG. 1 is a plan view schematically showing the configuration of a display device according to an embodiment of the present invention. All the components of the display device according to all embodiments of the present invention are operatively coupled and configured.

As shown in FIG. 1, the display device according to the embodiment of the present invention includes a display panel 100 for displaying an image and a backlight assembly for providing light to the display panel 100.

The display panel 100 includes a display area DA for displaying an image and a non-display area NDA located around the display area DA. At this time, the display area DA includes a first display area DA1 located at a left side thereof and a second display area DA2 located at a right side thereof. The display panel 100 includes a display substrate 110, a counter substrate 120 facing the display substrate 110 and a liquid crystal layer interposed between the display substrate 110 and the counter substrate 120.

In the first display area DA1 of the display substrate 110, a plurality of first data lines DL1-1, ..., DL1-n extending in a first direction D1 and arranged at a predetermined distance in a second direction D2 perpendicular to the first direction and a plurality of first gate lines GL1-1, ..., GL1-m extending in the second direction and arranged at a predetermined distance in the first direction are provided.

In the second display area DA2 of the display substrate 110, a plurality of second data lines DL2-1, ..., DL2-n extending in the first direction D1 and arranged at a predetermined distance in the second direction D2 and a plurality of second gate lines GL2-1, ..., GL2-m extending in the second direction D2 and arranged at a predetermined distance in the first direction D1 are provided.

The non-display area NDA includes an area adjacent to one end of the plurality of first data lines DL1-1, ..., DL1-n and the plurality of second data lines DL2-1, ..., DL2-n, an area adjacent to one end of the plurality of first gate lines GL1-1, ..., GL1-m and an area adjacent to one end of the plurality of second gate lines GL2-1, ..., GL2-m.

In addition, a first data driving unit 131 for outputting data signals for displaying an image to the plurality of first data lines DL1-1, ..., DL1-n is formed in the non-display area NDA. A second data driving unit 132 for outputting data signals for displaying an image to the plurality of second data lines DL2-1, ..., DL2-n is formed in the non-display area NDA. At this time, the first and second data driving units 131 and 132 are mounted on the display panel 100 in the form of a chip.

In addition, a first gate driving unit 121 for outputting gate signals for displaying an image to the plurality of first gate lines GL1-1, ..., GL1-m is formed in the non-display area NDA.

In addition, a second gate driving unit 122 for outputting gate signals for displaying an image to the plurality of second gate lines GL2-1, ..., GL2-m is formed in the non-display area NDA. At this time, the first and second gate driving units 121 and 122 are mounted on the display panel 100 in the form of a chip.

A flexible printed circuit board 150 electrically connected to the first and second data driving units 131 and 132 and the first and second gate driving units 121 and 122 to provide various external signals to the first and second data driving units 131 and 132 and the first and second gate driving units 121 and 122 is attached to an end of the non-display area NDA. The flexible printed circuit board 150 includes a first timing controller 151 for controlling the first data driving unit 131 and a second timing controller 152 for controlling the second data driving unit 132.

Figure 2:
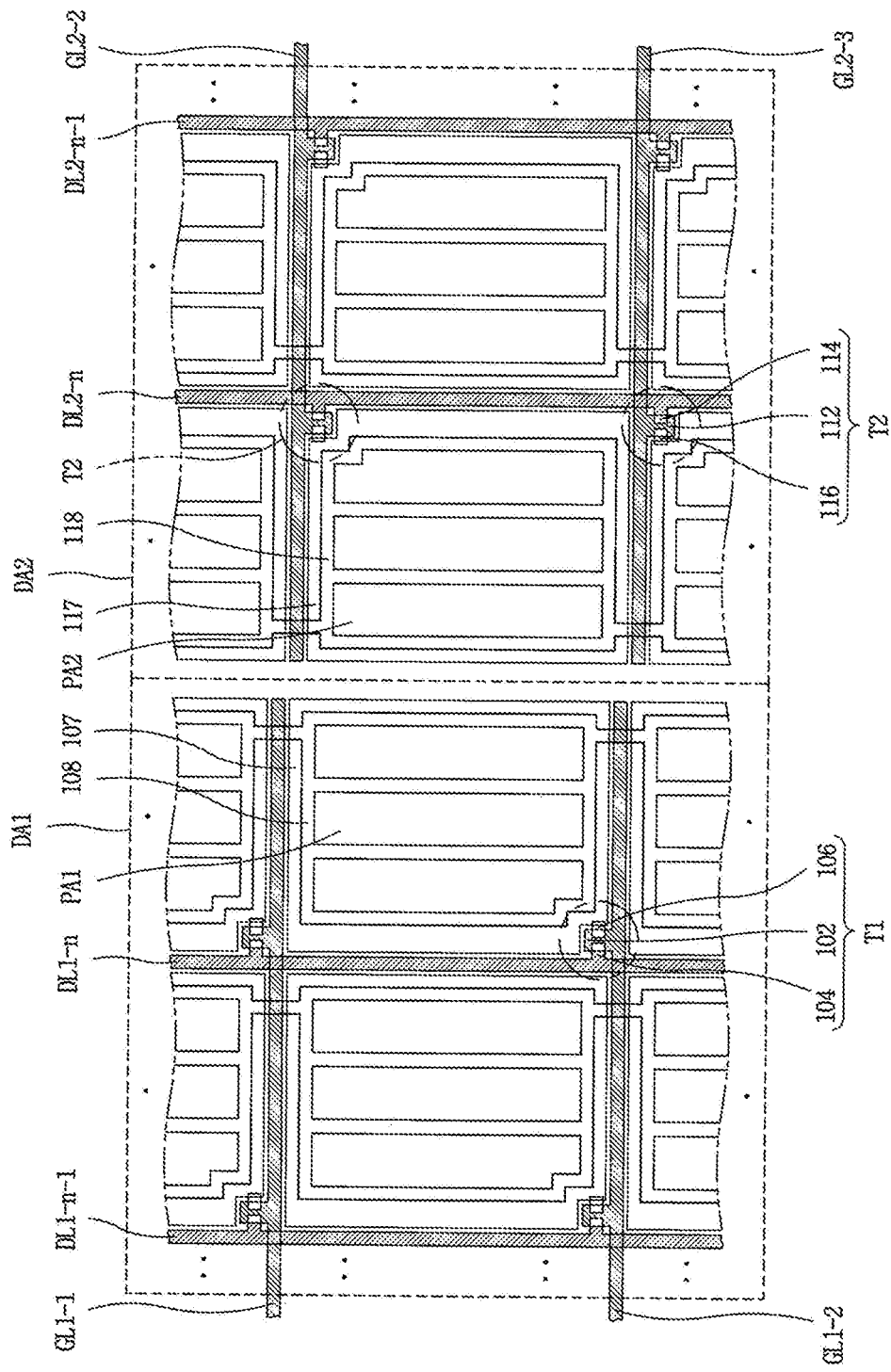
FIG. 2 is an enlarged plan view showing in detail the configuration of the display device according to the embodiment of the present invention.

FIG. 2 is an enlarged plan view showing in detail the configuration of the display device according to the embodiment of the present invention.

As shown in FIG. 2, the display area DA is split into the first display area DA1 and the second display area DA2 and a plurality of first pixel areas PA1 and second pixel areas PA2 is formed in the first display area DA1 and the second display area DA2, respectively.

The first pixel areas PA1 are defined by the plurality of first gate lines GL1-1, ..., GL1-m and the plurality of first data lines DL1-1, ..., DL1-n arranged to cross the plurality of first gate lines GL1-1, ..., GL1-m.

The second pixel areas PA2 are defined by the plurality of second gate lines GL2-1, ..., GL2-m and the plurality of second data lines DL2-1, ..., DL2-n arranged to cross the plurality of second gate lines GL2-1, ..., GL2-m.

A first thin film transistor (TFT) T1 and a first pixel electrode 107 are provided in each first pixel area PA1. A first gate electrode 102 of the first TFT T1 is branched from each of the plurality of first gate lines GL1-1, ..., GL1-m, a first source electrode 104 is branched from each of the first data lines DL1-1, ..., DL1-n, and a first drain electrode 106 is electrically connected to the first pixel electrode 107.

Accordingly, the first TFTs T1 output the data signals applied to the first data lines DL1-1, ..., DL1-n to the first pixel electrode 107 in response to gate signals applied from the first gate lines GL1-1, ..., GL1-m.

A second TFT T2 and a second pixel electrode 117 are provided in each second pixel area PA2. A second gate electrode 112 of the second TFT T2 is branched from each of second gate lines GL2-1, ..., GL2-j of the plurality of second gate lines GL2-1, ..., GL2-m, a second source electrode 114 is branched from each of the second data lines DL2-1, ..., DL2-n, and a second drain electrode 116 is electrically connected to the second pixel electrode 117.

Accordingly, the second TFTs T2 output the data signals applied to the second data lines DL2-1, ..., DL2-n to the second pixel electrode 117 in response to gate signals applied from the second gate lines GL2-1, ..., GL2-m.

The first and second pixel electrodes 107 and 117 are provided to face the first and second common electrodes 108 and 118 on the display substrate 120 (see FIG. 1). The liquid crystal layer is interposed between the display substrate 110 and the counter substrate 120.

At this time, the first and second pixel electrodes 107 and 117 are formed in the form of a large plate, and the first and second common electrodes 108 and 118 are provided to vertically face the first and second pixel electrodes 107 and 117. The first and second common electrodes 108 and 118 have a plurality of openings at a predetermined interval.

In a boundary area in which the first display area DA1 and the second display area DA2, the first gate lines GL1-1, ..., GL1-m and the second gate lines GL2-1, ..., GL2-m are separated from each other by a predetermined distance d1. For example, in the area in which the first display area DA1 and the second display area DA2 contact each other, the first gate lines GL1-1, ..., GL1-m and the second gate lines GL2-1, ..., GL2-m are separated from each other.

Accordingly, the first display area DA1 and the second display area DA2 may display different images or the same image.

Figure 3:
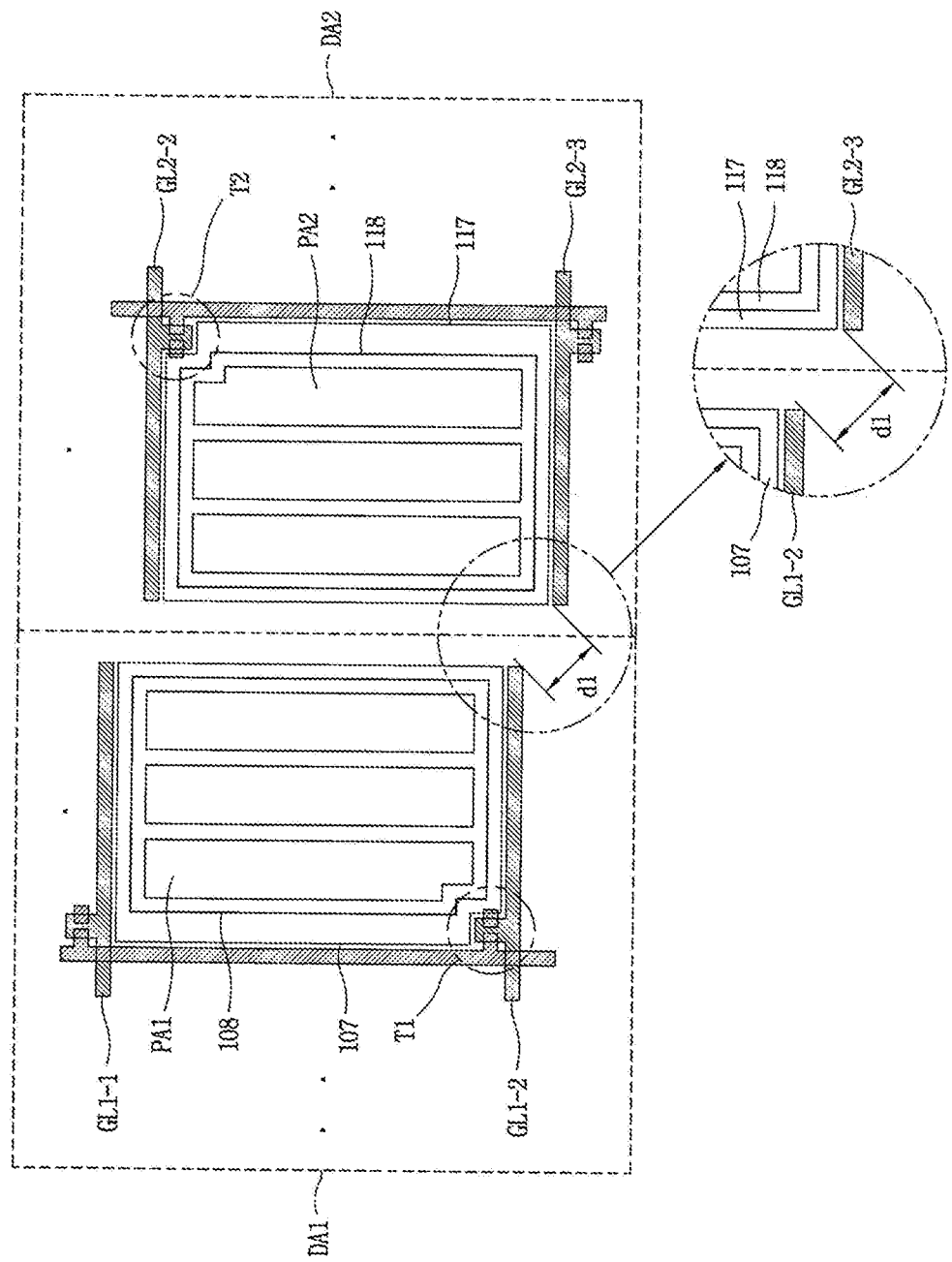
FIG. 3 is an enlarged plan view showing a portion of the display device according to the embodiment of the present invention.

FIG. 3 is an enlarged plan view showing a portion of the display device according to the embodiment of the present invention.

As shown in FIG. 3, the first gate lines GL1-1, ..., GL1-m and the second gate lines GL2-1, ..., GL2-m are separated from each other by a predetermined distance d1 in a diagonal direction.

The second gate lines GL2-1, ..., GL2-m configuring the second pixel areas PA2 of the second display area DA2 are located in parallel above the first gate lines GL1-1, ..., GL1-m configuring the first pixel areas PA1 of the first display area DA1 provided in correspondence with the second pixel areas PA2 to correspond to each other in a diagonal direction.

The second thin film transistors T2 formed at intersections between the second gate lines GL2-1, ..., GL2-m and the second data lines DL2-1, ..., DL2-n configuring the second pixel areas PA2 of the second display area DA2 are provided to correspond to the first thin film transistors T1 formed at intersections between the first gate lines GL1-1, ..., GL1-m and the first data lines DL1-1, ..., DL1-n configuring the first pixel areas PA1 of the first display area DA1 provided in correspondence with the second pixel areas PA2 in a diagonal direction.

The first gate lines GL1-1, ..., GL1-m of the first display area DA1 are spaced apart from the second gate lines GL2-1, ..., GL2-m of the second display area DA2 by a first distance d1. At this time, the first gate lines GL1-1, GL1-m and the second gate lines GL2-1, ..., GL2-m spaced apart from each other by the first distance d1 are provided in a diagonal direction.

In addition, the layout of the second gate lines GL2-1, ..., GL2-m and the second data lines DL2-1, ..., DL2-n of the second display area DA2 are equal to that of the 180-degree rotated first gate lines GL1-1, ..., GL1-m and the first data lines DL1-1, ..., DL1-n of the first display area DA1.

For example, as shown in FIG. 3, the first gate line GL1-1 of the first display area DA1 is spaced apart from the second gate line GL2-2 of the second display area DA2 by the first distance d1 in a diagonal direction.

Accordingly, in the present invention, the layout of the second gate lines GL2-1, ..., GL2-m and the second data lines DL2-1, ..., DL2-n of the second display area DA2 is equal to that of the 180-degree rotated first gate lines GL1-1, ..., GL1-m and the first data lines DL1-1, ..., DL1-n of the first display area DA1, such that the second gate lines GL2-1, ..., GL2-m of the second display area DA2 are separated from the first gate lines GL1-1, ..., GL1-m of the first display area DA1 in a diagonal direction, thereby increasing the distance d1 between the first gate lines GL1-1, ..., GL1-m and the second gate lines GL2-1, ..., GL2-m. Therefore, static electricity can be prevented from occurring between electrodes. Since static electricity occurs between adjacent electrodes in horizontally split portions of the gate lines, the horizontally split gate lines are provided to be separated as far from each other as possible in a diagonal direction.

Figure 4:
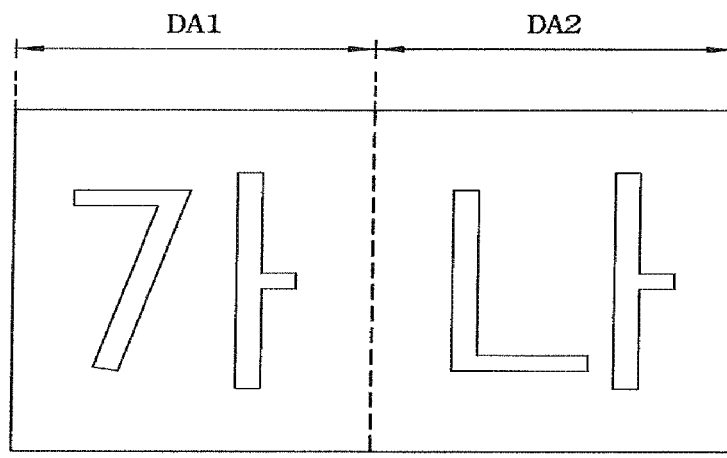
FIG. 4 is a diagram showing different images displayed in a first display area and a second display area of the display panel shown in FIG. 1.

FIG. 4 is a diagram showing different images displayed in a first display area and a second display area of the display panel shown in FIG. 1.

As shown in FIG. 4, an image "가" is displayed in the first display area DA1 of the display area DA and an image "나" is displayed in the second display area DA2.

That is, the flexible printed circuit board 150 provides a first gate signal and a first data signal for displaying the image "가" to the first gate driving unit 121 and the first data driving unit 131, under control of the first timing controller 151.

As the first gate lines GL1-1, ..., GL1-m are sequentially operated by the first gate signal and the first data signal is supplied to the first data lines DL1-1, ..., DL1-n, the image "가" is displayed in the first display area DA1. At this time, since the first gate signal is not provided to the second gate lines GL2-1, GL2-m, the image "가" is not displayed in the second display area DA2.

In addition, the flexible printed circuit board 150 provides a second gate signal and a second data signal for displaying the image "나" to the second gate driving unit 122 and the second data driving unit 132, under control of the second timing controller 152.

As the second gate lines GL2-1, ..., GL2-m are sequentially operated by the second gate signal and the second data signal is supplied to the plurality of second data lines DL2-1, ..., DL2-n, the image "나" is displayed in the second display area DA2. At this time, since the second gate signal is not provided to the first gate lines GL1-1, ..., GL1-m, the image "나" is not displayed in the first display area DA1.

The first display area DA1 and second display area DA2 of the display area DA may display different images and perform different operations. However, one image may be displayed in the first and second display areas DA1 and DA2.

The same image, that is, "다", is displayed in the first display area DA1 and the second display area DA2. That is, the flexible printed circuit board 150 provides a third gate signal and a third data signal for displaying an image corresponding to the left portion of the image "다" to the first gate driving unit 121 and the first data driving unit 131, under control of the first timing controller 151.

The flexible printed circuit board 150 provides a fourth gate signal and a fourth data signal for displaying an image corresponding to the remaining portion of the image "다" to the second gate driving unit 122 and the second data driving unit 132, under control of the second timing controller 152.

As the first gate lines GL1-1, ..., GL1-m are sequentially operated by the third gate signal and the third data signal is supplied to the first data lines DL1-1, ..., DL1-n, the image of the left portion of the image "다" is displayed in the first display area DA1.

As the second gate lines GL2-1, ..., GL2-m are sequentially operated by the fourth gate signal and the fourth data signal is supplied to the second data lines DL2-1, ..., DL2-n, the image of the right portion of the image "다" is displayed in the second display area DA2.

Accordingly, one image is implemented in the first display area DA1 and the second display area DA2 to display the image "다".

Figure 5:
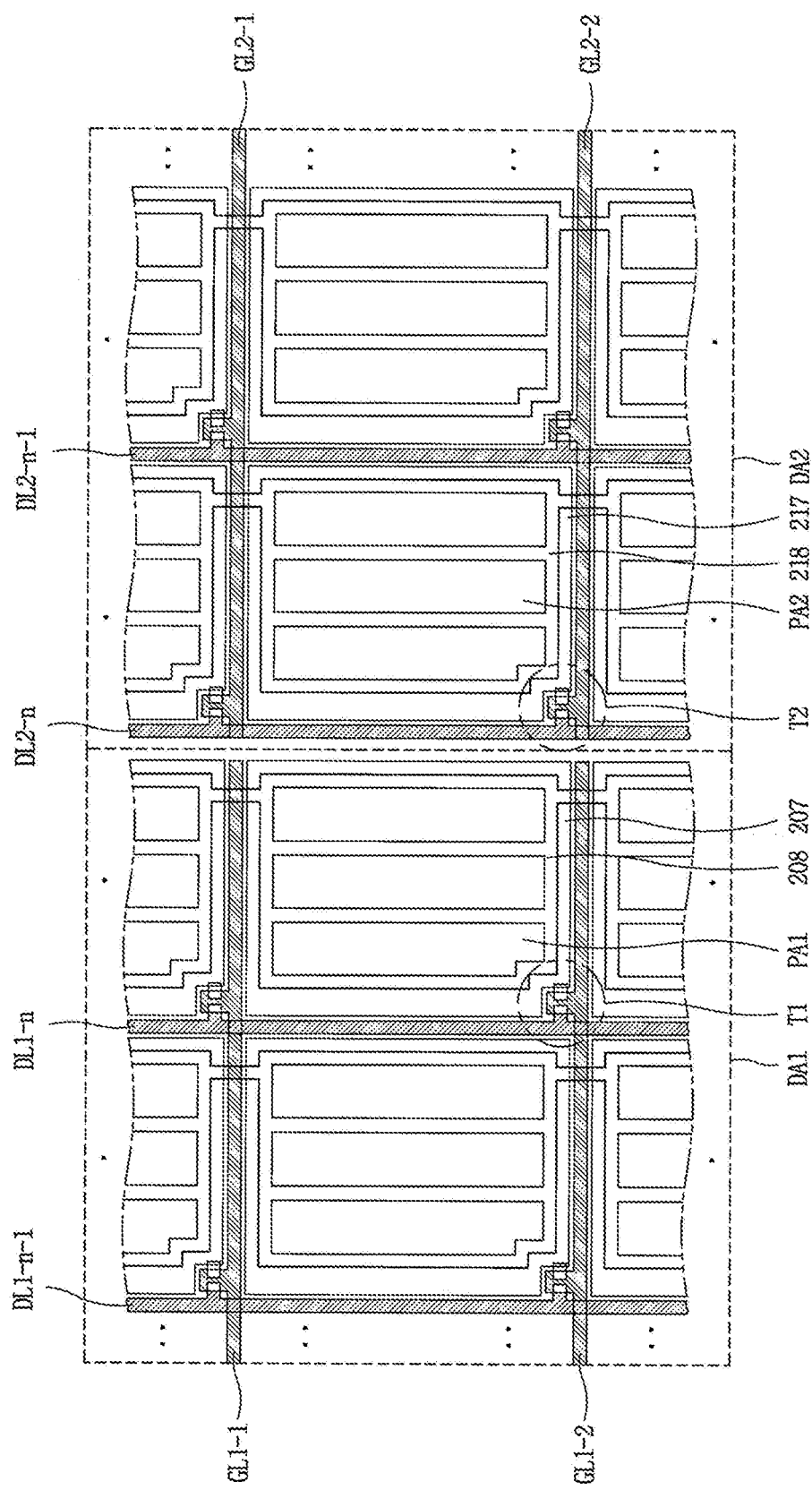
FIG. 5 is an enlarged plan view showing the configuration of a display device according to another embodiment of the present invention.

FIG. 5 is an enlarged plan view showing the configuration of a display device according to another embodiment of the present invention.

As shown in FIG. 5, the display device according to another embodiment of the present invention includes a first display area DA1 and a second display area DA2 and the first and second display areas DA1 and DA2 include a plurality of first pixel areas PA1 and a plurality of second pixel areas PA2, respectively.

The first pixel areas PA1 of the first display area DA1 are defined by areas formed by crossing the plurality of first gate lines GL1-1, ..., GL1-m and the plurality of first data lines DL1-1, ..., DL1-n.

In addition, the second pixel areas PA2 of the second display area DA2 are defined by areas formed by crossing the plurality of second gate lines GL2-1, ..., GL2-m and the plurality of second data lines DL2-1, ..., DL2-n.

A first TFT T1 and a first pixel electrode 207 are provided in each first pixel area PA1. A first gate electrode 202 of the first TFT T1 is branched from each of the first gate lines GL1-1, ..., GL1-m, a first source electrodes 204 is branched from each of the first data lines DL1-1, ..., DL1-n, and a first drain electrode 206 is electrically connected to the first pixel electrode 207.

Accordingly, the first TFTs T1 may output the data signals applied to the first data lines DL1-1, ..., DL1-n to the first pixel electrodes 207 in response to the gate signals applied from the first gate lines GL1-1, ..., GL1-m.

A second TFT T2 and a second pixel electrode 217 are provided in each second pixel area PA2. A second gate electrode 212 of the second TFT T2 is branched from each of the second gate lines GL2-1, ..., GL2-m, a second source electrode 214 is branched from each of the second data lines DL2-1, ..., DL2-n, and a second drain electrode 216 is electrically connected to the second pixel electrode 217.

Accordingly, the second TFTs T2 may output the data signals applied to the second data lines DL2-1, ..., DL2-n to the second pixel electrodes 217 in response to the gate signals applied from the second gate lines GL2-1, ..., GL2-m.

The first and second pixel electrodes 207 and 217 are provided to face the first and second common electrodes 208 and 218 on the display substrate 120 (see FIG. 1). The liquid crystal layer is interposed between the display substrate (e.g., see 110 of FIG. 1) and the counter substrate (e.g., see 120 of FIG. 1).

At this time, the first and second pixel electrodes 207 and 217 take the form of a large plate, and the first and second common electrodes 208 and 218 are provided to face the first and second pixel electrodes 207 and 217 in a vertical direction. The first and second common electrodes 208 and 218 have a plurality of openings at a predetermined interval.

In a boundary area in which the first display area DA1 and the second display area DA2, the plurality of first gate lines GL1-1, ..., GL1-m and the plurality of second gate lines GL2-1, ..., GL2-m are separated from each other by a predetermined distance d2. For example, in the area in which the first display area DA1 and the second display area DA2 contact each other, the first gate lines GL1-1, ..., GL1-m of the first pixel area PA1 and the second gate lines GL2-1, ..., GL2-m of the second pixel areas PA2 are separated from each other by the second distance d2.

In particular, the first gate lines GL1-1, ..., GL1-m of the first pixel areas PA1 and the second gate lines GL2-1, ..., GL2-m of the second pixel areas PA2 are spaced apart from each other by the second distance d2, thereby preventing static electricity from occurring between adjacent electrodes in horizontally split portions of the gate lines.

Accordingly, the display device according to another embodiment of the present invention can display different images and/or the same images in the first display area DA1 and the second display area DA2 by preventing static electricity from occurring between adjacent electrodes in the horizontally split portions of the gate lines.

Figure 6:
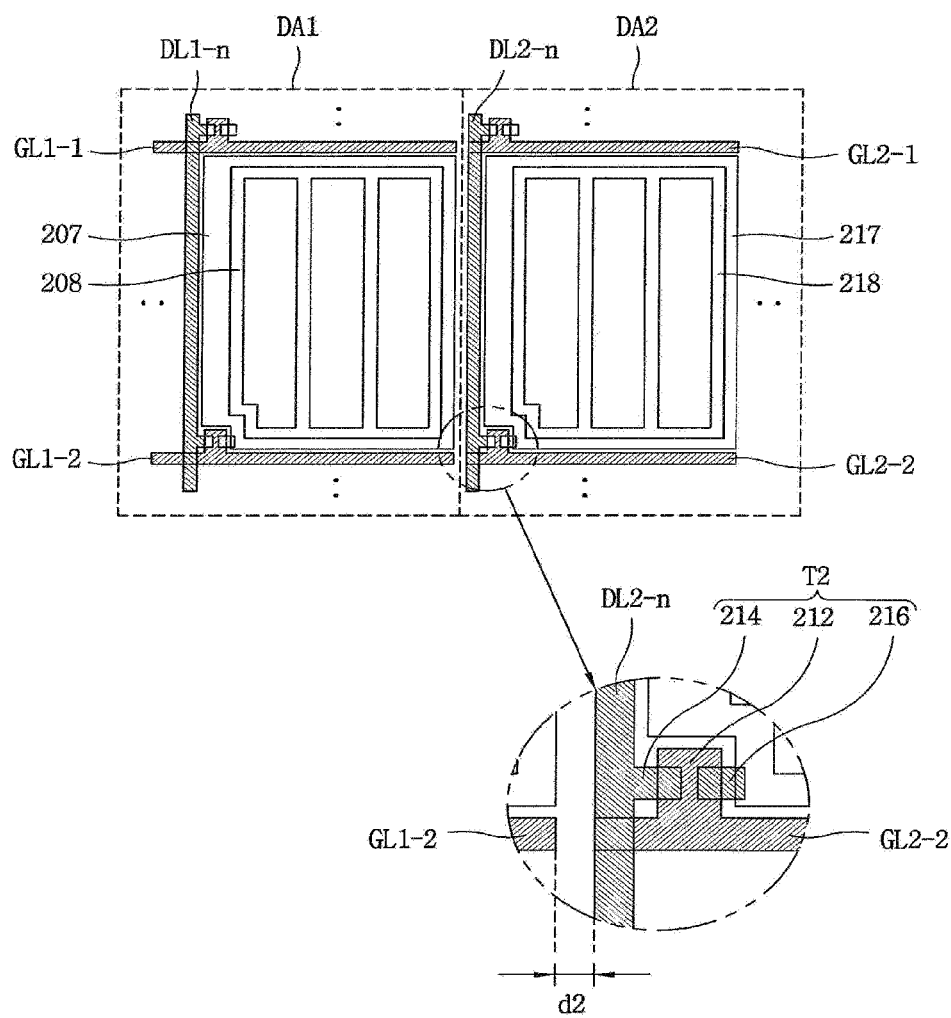
FIG. 6 is an enlarged plan view showing a portion of a display device according to another embodiment of the present invention.

FIG. 6 is an enlarged plan view showing a portion of a display device according to another embodiment of the present invention.

As shown in FIG. 6, the first gate lines GL1-1, ..., GL1-m of the first display area DA1 and the second gate lines GL2-1, ..., GL2-m of the second display area DA2 are provided on the same line in a state of being separated by the second distance d2. At this time, the second distance d2 may be less than the first distance d1 of the above-described embodiment of the present invention.

The second gate lines GL2-1, ..., GL2-m configuring the second pixel areas PA2 of the second display area DA2 are provided on the same line as the first gate lines GL1-1, ..., GL1-m configuring the first pixel areas PA1 of the first display area DA1 provided in correspondence with the second pixel areas PA2.

In addition, the first gate lines GL1-1, ..., GL1-m of the first display area DA1 and the second gate lines GL2-1, ..., GL2-m of the second display area DA2 may be provided on the same line in parallel in a state of being separated from each other by the predetermined distance.

The second gate lines GL2-1, ..., GL2-m of the second display area DA2 separated from the first gate lines GL1-1, ..., GL1-m of the first display area DA1 overlap the second data line DL2-n located at the outermost side of the second display area DA2.

Figure 7:
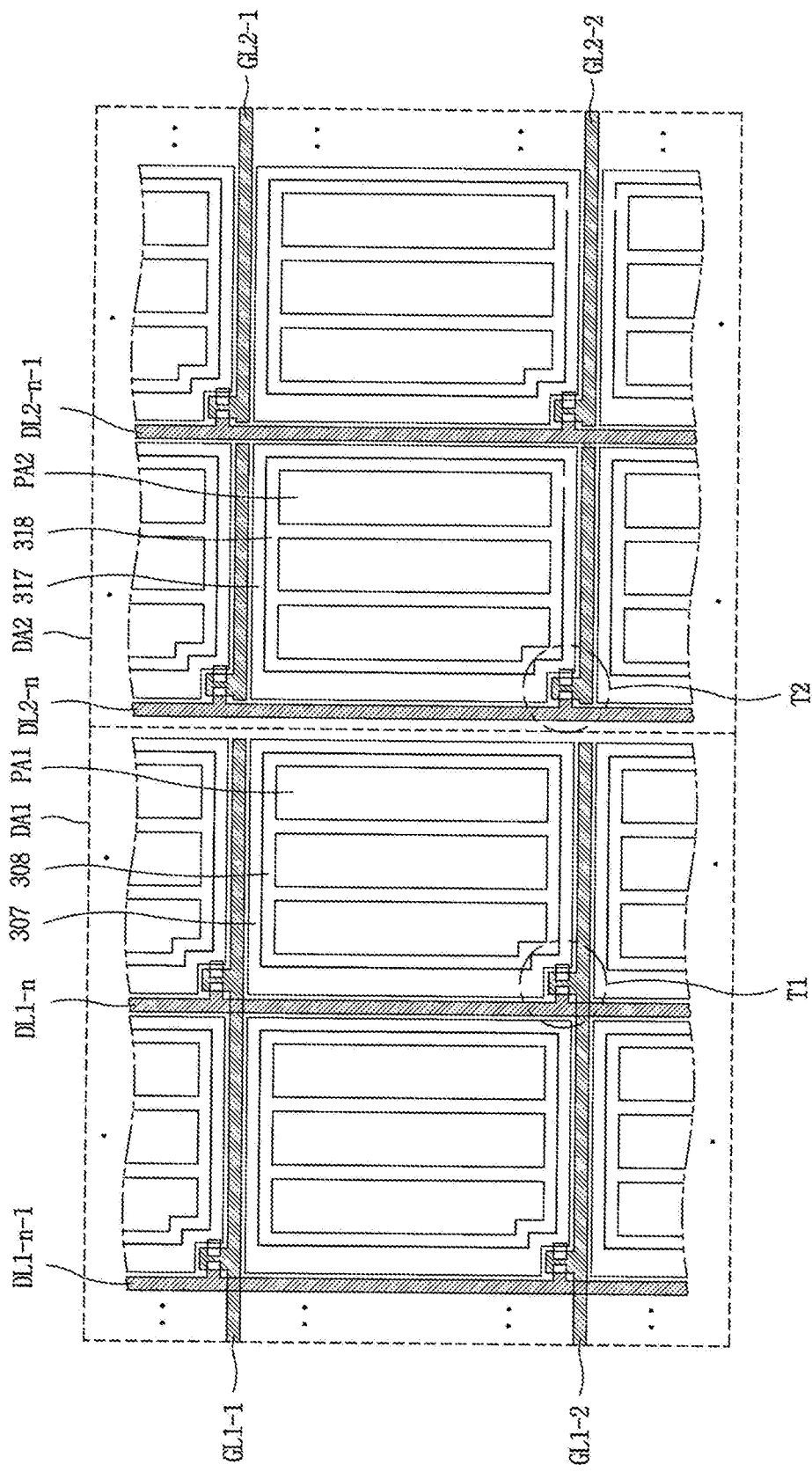
FIG. 7 is an enlarged plan view showing the configuration of a display device according to another embodiment of the present invention.

FIG. 7 is an enlarged plan view showing the configuration of a display device according to another embodiment of the present invention.

As shown in FIG. 7, a first display area DA1 and a second display area DA2 configuring a display area DA include a plurality of first pixel areas PA1 and a plurality of second pixel areas PA2.

The first pixel areas PA1 of the first display area DA1 are defined by areas formed by crossing a plurality of first gate lines GL1-1, ..., GL1-m and a plurality of first data lines DL1-1, ..., DL1-n.

The second pixel areas PA2 of the second display area DA2 are defined by areas formed by crossing a plurality of second gate lines GL2-1, ..., GL2-m and a plurality of second data lines DL2-1, ..., DL2-n.

In each first pixel area PA1, a first TFT T1 and a first pixel electrode 307 are provided. A first gate electrode 302 of the first TFT T1 is branched from each of the plurality of first gate lines GL1-1, ..., GL1-m, a first source electrode 304 is branched from each of the first data lines DL1-n, ..., DL1-n, and the first drain electrode 306 is electrically connected to the first pixel electrode 307.

Accordingly, the first TFTs T1 output the data signals applied to the first data lines DL1-1, ..., DL1-n to the first pixel electrodes 307 in response to gate signals applied from the first gate lines GL1-1, ..., GL1-m.

In each second pixel area PA2, a second TFT T2 and a second pixel electrode 317 are provided. A second gate electrode 312 of the second TFT T2 is branched from each of the second gate lines GL2-1, ..., GL2-m, a second source electrode 314 is branched from each of the second data lines DL2-1, ..., DL2-n, and a second drain electrode 316 is electrically connected to second pixel electrodes 317.

Accordingly, the second TFTs T2 output the data signals applied to the second data lines DL2-1, ..., DL2-n to the second pixel electrodes 317 in response to gate signals applied from the second gate lines GL2-1, ..., GL2-m.

The first and second pixel electrodes 307 and 317 are provided to face the first and second common electrodes 308 and 318 on the display substrate 120 (see FIG. 1). The liquid crystal layer is interposed between the display substrate (e.g., see 110 of FIG. 1) and the counter substrate (e.g., see 120 of FIG. 1).

At this time, the first and second pixel electrodes 307 and 317 are formed in the form of a large plate, and the first and second common electrodes 308 and 318 are provided to face the first and second pixel electrodes 307 and 317 in a vertical direction. The first and second common electrodes 308 and 318 have a plurality of openings at a predetermined interval.

In a boundary area in which the first display area DA1 and the second display area DA2, the plurality of first gate lines GL1-1, ..., GL1-*m* and the plurality of second gate lines GL2-1, ..., GL2-*m* are separated from each other by a predetermined distance d3. For example, the first gate lines GL1-1, ..., GL1-*m* of the first pixel areas PA1 and the second gate lines GL2-1, ..., GL2-*m* of the second pixel areas PA2 located in an area in which the first display area DA1 and the second display area DA2 contact each other are separated from each other by the third distance d3. At this time, the third distance d3 is greater than the second distance d2 according to another embodiment of the present invention.

In particular, the second gate lines GL2-1, ..., GL2-*m* of the second display area are spaced apart from the second data line DL2-*n* located at the outermost side of the second display area by the predetermined distance d3 without overlapping, thereby increasing the distance between the second gate lines and the first gate lines to prevent static electricity between the electrodes.

Accordingly, in the display device according to another embodiment of the present invention, static electricity is prevented from occurring between adjacent electrodes in the horizontally split portions of the gate lines, such that different images and/or the same image are displayed in the first display area DA1 and the second display area DA2.

Figure 8:
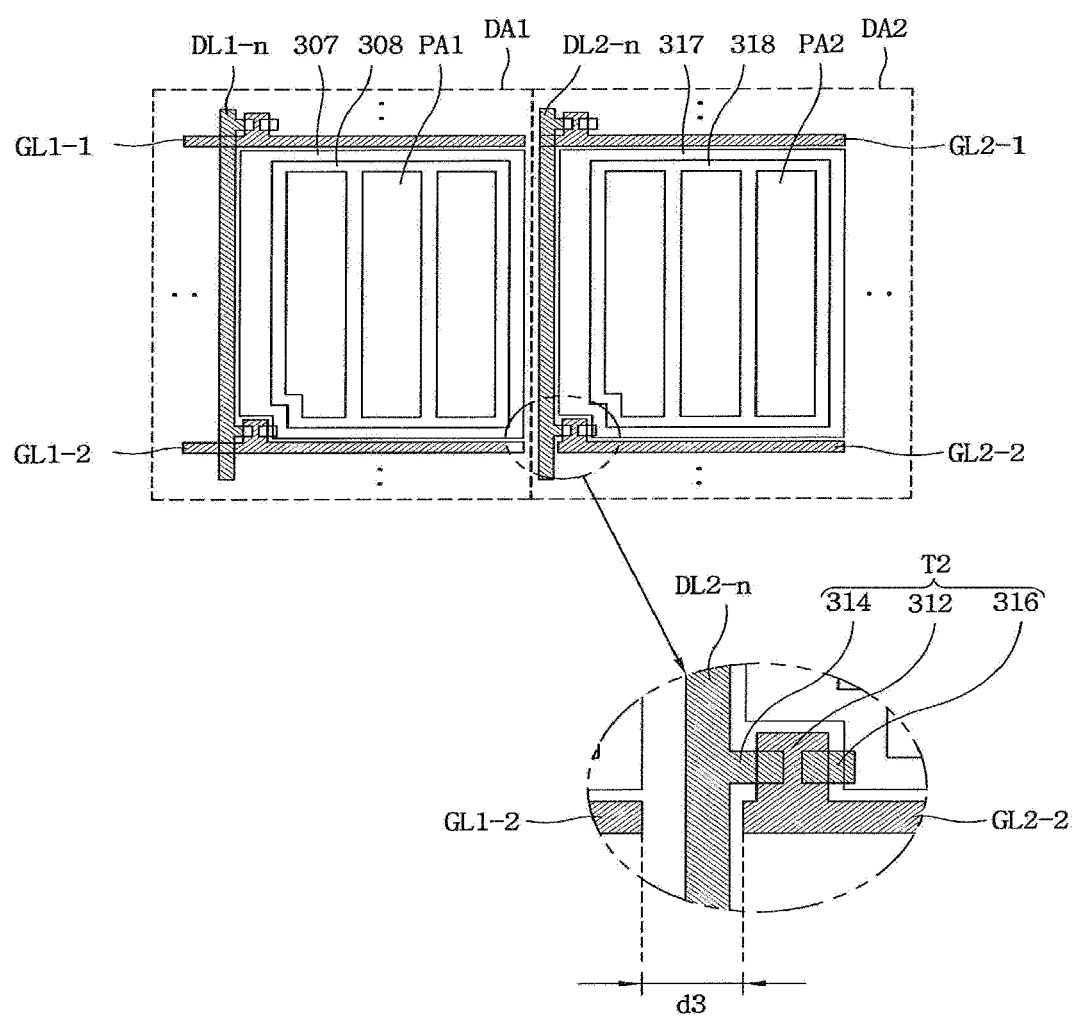
FIG. 8 is an enlarged plan view showing a portion of a display device according to another embodiment of the present invention.

FIG. 8 is an enlarged plan view showing a portion of a display device according to another embodiment of the present invention.

As shown in FIG. 8, the first gate lines GL1-1, ..., GL1-*m* of the first display area DA1 and the second gate lines GL2-1, ..., GL2-*m* of the second display area DA2 are provided on the same line in a state of being separated from each other by the second distance d2. At this time, the second distance d2 may be less than the first distance d1 of the above-described embodiment of the present invention.

The second gate lines GL2-1, ..., GL2-*m* configuring the second pixel areas PA2 of the second display area DA2 are provided on the same line as the first gate lines GL1-1, ..., GL1-*m* configuring the first pixel areas PA1 of the first display area DA1 provided in correspondence with the second pixel areas PA2.

In addition, the first gate lines GL1-1, ..., GL1-*m* of the first display area DA1 and the second gate lines GL2-1, ..., GL2-*m* of the second display area DA2 may be provided on the same line in parallel in a state of being separated from each other by the predetermined distance.

The second gate lines GL2-1, ..., GL2-*m* of the second display area DA2 separated from the first gate lines GL1-1, ..., GL1-*m* of the first display area DA1 are spaced apart from the second data line DL2-*n* located at the outermost side of the second display area DA2 by the predetermined distance d3.

As described above, in the display device according to one or more embodiments of the present invention, since the gate lines corresponding to the first display area and the second display area are separated from each other and are independently driven, it is possible to perform a dual display function for independently implementing different images on one screen.

In the display device according to one or more embodiments of the present invention, since the first gate lines of the first display area and the second gate lines of the second display area are separated from each other by the predetermined distance, different images or the same image can be implemented in the first display area and the second display area. Therefore, even when a portion of the display device, that is, the first display area or the second display area, is damaged by external impact, a desired image can be continuously implemented in the other display area.

In addition, the display device according to one or more embodiments of the present invention is suitable for military display products or industrial display products frequently exposed to impact, because the first gate lines of the first display area and the second gate lines of the second display area are separated from each other such that different images or the same image is implemented in the first display area and the second display area. In particular, in the display device according to the present invention, the display area may be used as one display area or divided into the first display area and the second display area. Therefore, in a normal state, the display area may be used as one screen. However, when any one of the first and second display areas of the display device is damaged by impact, only the other area may be used.

Further, in the display device according to one or more embodiments of the present invention, the layout of the second gate lines and second data lines of the second display area is equal to that of the 180-degree rotated first gate lines and first data lines of the first display area, such that the second gate lines of the second display area are provided to correspond to the first gate lines of the first display area in a diagonal direction, the first gate lines of the first display area and the second gate lines of the second display area are separated from each other by the predetermined distance, or the second gate lines of the second display area are spaced apart from the second data line located at the outermost side of the second display area without overlapping. Therefore, the distance between the second gate lines and the first gate lines increases, thereby preventing static electricity from occurring between the electrodes.

Accordingly, in the display device according to one or more embodiments of the present invention, the distance between the first gate lines of the first display area and the second gate lines of the second display area is maximized to prevent static electricity from occurring between the electrodes, thereby increasing product yield.

In addition, the display device according to one or more embodiments of the present invention is applicable to an organic light emitting diode (OLED) display device, a curved display device, a rollable display device and a bendable display device, in addition to a liquid crystal display (LCD) device.

Those skilled in the art will appreciate that the present invention may be carried out in other specific ways than those set forth herein without departing from the spirit and essential characteristics of the present invention.

The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:
1. A display device comprising:
   a display panel having a first display area and a second display area and configured to display an image in the first and second display areas;
   a plurality of first gate lines located on the display panel corresponding to the first display area;
   a plurality of second gate lines separated from the first gate lines and located on the display panel corresponding to the second display area;

a plurality of first data lines provided on the display panel corresponding to the first display area to cross the first gate lines and defining a plurality of first pixel areas configuring the first display area;
a plurality of second data lines provided on the display panel corresponding to the second display area to cross the second gate lines and defining a plurality of second pixel areas configuring the second display area;
a plurality of first thin film transistors at intersections between the first gate lines and the first data lines; and
a plurality of second thin film transistors at intersections between the second gate lines and the second data lines,
wherein the first pixel areas and the second pixel areas have the same size,
wherein a separation area is interposed between ends of the first gate lines and ends of the second gate lines that face each other, and a width of the separation area is equal to or wider than a width of the thin film transistors,
wherein a separation distance between the first pixel areas and the second pixel areas is not less than the width of the separation area, and
wherein the second gate lines are located in parallel above the first gate lines to correspond to each other in a diagonal direction.

2. The display device according to claim 1, the first gate lines and the second gate lines are separated from each other by a predetermined distance in a diagonal direction.

3. The display device according to claim 1, wherein a layout of the second thin film transistors, the second gate lines and the second data lines is equal to a layout of the 180-degree rotated first thin film transistors, first gate lines and the first data lines.

4. The display device according to claim 1, wherein the first gate lines and the second gate lines are provided in parallel on the same line to be spaced apart from each other by the predetermined distance.

5. The display device according to claim 1, wherein the second gate lines overlap a second data line located adjacent to a boundary of the first display area and the second display area.

6. The display device according to claim 1, wherein the second gate lines are provided to be spaced apart from a second data line located adjacent to a boundary of the first display area and the second display area.

7. The display device according to claim 1, further comprising:
a first driving unit for providing first driving signals for displaying the image to the first gate lines and the first data lines; and
a second driving unit for providing second driving signals for displaying the image to the second gate lines and the second data lines.

8. The display device according to claim 7, wherein the first driving unit includes:
a first gate driving unit for providing first gate signals to the first gate lines;
a first data driving unit for providing first data signals to the first data lines; and
a first timing controller for controlling the first gate driving unit and the first data driving unit, and
wherein the first driving signals include the first gate signals and the first data signals.

9. The display device according to claim 7, wherein the second driving unit includes:
a second gate driving unit for providing second gate signals to the second gate lines;
a second data driving unit for providing second data signals to the second data lines; and
a second timing controller for controlling the second gate driving unit and the second data driving unit, and
wherein the second driving signals include the second gate signals and the second data signals.

10. The display device according to claim 1, wherein the display device is any one of a liquid crystal display (LCD), an organic light emitting diode (OLED) display device, a curved display device, a rollable display device and a bendable display device.

11. The display device according to claim 1, wherein images implemented in the first display area and the second display area are different from or equal to each other.

12. The display device according to claim 1, wherein the first display area and the second display area are separated by the predetermined distance, and a separation area is interposed between the first display area and the second display area, and
wherein the plurality of first gate lines, the plurality of second gate lines, the plurality of first data lines, and the plurality of second data lines are absent in the separation area.

13. The display device according to claim 1, wherein each of the first thin film transistors is disposed at an upper side of each of the first gate lines, and each of the second thin film transistors is disposed at a lower side of each of the second gate lines.

14. The display device according to claim 1, wherein the first thin film transistors is disposed at a right side of the first data lines, and each of the second thin film transistors is disposed at a left side of the second data lines.

15. A display device comprising:
a display panel having a first display area and a second display area and configured to display an image in the first and second display areas;
a plurality of first gate lines located on the display panel corresponding to the first display area;
a plurality of second gate lines separated from the first gate lines and located on the display panel corresponding to the second display area;
a plurality of first data lines provided on the display panel corresponding to the first display area to cross the first gate lines and defining a plurality of first pixel areas configuring the first display area; and
a plurality of second data lines provided on the display panel corresponding to the second display area to cross the second gate lines and defining a plurality of second pixel areas configuring the second display area,
wherein the first pixel areas and the second pixel areas have the same size,
wherein the first gate lines and the second gate lines are separated from each other by a predetermined distance,
wherein a separation distance between the first pixel areas and the second pixel areas is not less than the predetermined distance, and
wherein the second gate lines are located in parallel above the first gate lines to correspond to each other in a diagonal direction.

16. The display device according to claim 15, wherein the separation distance and the predetermined distance are the same.

17. The display device according to claim 15, wherein the separation distance and the predetermined distance are different.

18. The display device according to claim 1, wherein the separation distance and the width of the separation area are different.

* * * * *